(12) United States Patent
Gerchman et al.

(10) Patent No.: US 6,292,869 B1
(45) Date of Patent: Sep. 18, 2001

(54) SYSTEM AND METHOD FOR MEMORY SCRUB DURING SELF TIMED REFRESH

(75) Inventors: Edward T. Gerchman, Endwell; Mark C. Gildea, Apalachin, both of NY (US); Randall S. Jensen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/144,248

(22) Filed: Aug. 31, 1998

(51) Int. Cl.[7] .................................................. G06F 12/00
(52) U.S. Cl. ......................... 711/106; 365/222; 714/746; 714/754
(58) Field of Search .......................... 711/106, 159; 365/222; 714/2, 48, 52, 746, 747, 754

(56) References Cited

U.S. PATENT DOCUMENTS

| | | |
|---|---|---|
| 4,542,454 | 9/1985 | Breich et al. ................ 711/106 |
| 4,694,454 | 9/1987 | Matsuura ......................... 714/6 |
| 4,748,627 | 5/1988 | Ohsawa ......................... 714/764 |
| 4,935,900 | 6/1990 | Ohsawa ......................... 365/222 |
| 5,446,741 | * 8/1995 | Boldt et al. ................... 714/718 |
| 5,471,430 | * 11/1995 | Sawada et al. ................ 365/222 |
| 5,495,491 | 2/1996 | Snowden et al. ............. 714/764 |
| 5,748,547 | * 5/1998 | Shau ............................. 365/222 |
| 5,907,857 | * 5/1999 | Biswas ......................... 711/106 |
| 5,966,725 | 10/1999 | Tabo . |

* cited by examiner

Primary Examiner—Tuan V. Thai
Assistant Examiner—Matthew D. Anderson
(74) Attorney, Agent, or Firm—Shelley M Beckstrand

(57) ABSTRACT

A storage controller, upon detecting an interval of storage inactivity, inhibits external storage refresh commands and places the storage in self timed refresh (STR) mode. Upon detecting storage activity while storage is in STR mode, the controller terminates STR mode in storage. Upon detecting a scrub request while storage is in STR mode, the controller terminates STR mode in the storage and thereafter services the scrub request. Upon completing execution of the scrub request, the controller returns storage to STR mode.

6 Claims, 3 Drawing Sheets

SYSTEM AND METHOD FOR MEMORY SCRUB DURING SELF TIMED REFRESH

CROSS REFERENCES TO RELATED APPLICATIONS

U.S. patent application Ser. No. 09/144,593 entitled "SYSTEM AND METHOD FOR MEMORY SELF-TIMED REFRESH FOR REDUCED POWER CONSUMPTION", filed concurrently herewith is assigned to the same assignee hereof and contains subject matter related, in certain respect, to the subject matter of the present application. The above-identified patent application is incorporated herein by reference.

BACKGROUND OF THE INVENTION

1. Technical Field of the Invention

This invention relates to correction of soft errors in computer memory by scrubbing. More particularly, it relates to scrub operations which interrupt SDRAM memory STR mode.

2. Background Art

Dynamic Random Access Memory (DRAM) chips need to have the charge in their array cells periodically refreshed to retain the data contents. This refresh is normally initiated by commands issued by a memory controller external to the DRAMs. Synchronous DRAMs (SDRAMs) provide a mode, Self-Timed Refresh (STR) mode, during which the SDRAM initiates refresh internally provided no read or write accesses to memory occur. Computer SDRAM memory subsystems utilize less power for STR mode verses externally initiated refresh.

Further to reduce power consumption, SDRAM memory can be put in a self-timed refresh mode during which read or write requests are not allowed. A memory controller would typically wait for an interval of no memory activity (such as, reads or writes) before causing SDRAMs to enter STR mode.

Soft errors in computer memory are often corrected by scrubbing. Scrubbing refers to periodically or otherwise reading data, correcting any correctable errors, and writing the corrected data back to memory.

If scrubbing is suspended when the memory is in self-timed refresh mode, soft errors can accumulate in the memory. If scrubbing is not suspended during self-time refresh (STR) mode, the memory must exit self-timed refresh to execute the scrubbing operation. After the scrubbing operation, if another interval of time is waited and there are no system or I/O read or write requests to memory, unnecessary power is consumed.

It is an object of the invention to provide an improved memory controller.

It is a further object of the invention to provide an improved controller system and method for memory refresh and scrub operations.

It is a further object of the invention to provide for reduced power memory refresh and scrub operations.

SUMMARY OF THE INVENTION

In accordance with the invention, a system and method is provided for scrubbing computer storage. Upon detecting an interval of storage inactivity, external storage refresh commands are inhibited and the storage is placed in self timed refresh (STR) mode. Upon detecting storage activity while storage is in STR mode, STR mode is terminated. Upon detecting a scrub request while storage is in STR mode, STR mode is terminated and thereafter the scrub request is executed. Upon completing execution of the scrub request, storage is returned to STR mode.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
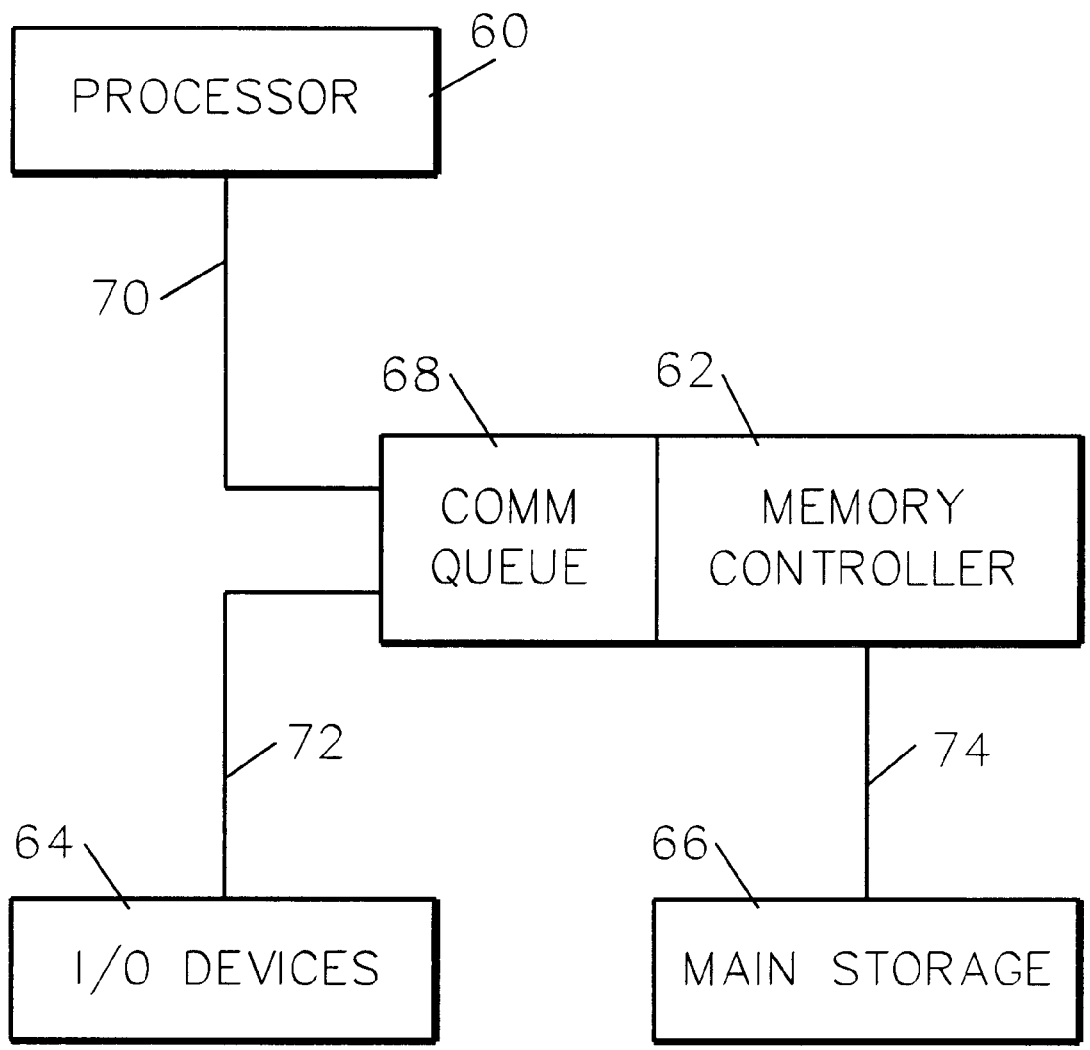
FIG. 1 illustrates a system including the memory controller of the preferred embodiment of the invention.

Referring to FIG. 1, memory controller 62 interfaces main storage 66 on memory bus 74 to processor 60 and I/O devices 64 via an internal command queue 68 which interfaces system bus 70 and I/O bus 72.

In operation, memory controller 62 detects an interval of inactivity; that is, a period during which there are no read or write access from processor 60 or I/O devices 64 with respect to main storage (also referred to as memory SDRAMs) 66. Upon detecting such an interval of inactivity, controller 62 halts external refresh commands from processor 60, initiates STR mode in storage 66 to preserve data contents in the memory SDRAMs and to save energy. Then, upon detecting a read or write operation, controller 62 signals storage 66 to exit STR mode.

In accordance with the preferred embodiment of the invention, memory controller 62 places SDRAM memory 66 into STR mode after an interval of inactivity to save power, and also periodically scrubs memory 66 by generating period requests to read memory contents, correct any soft errors, and write back the corrected data to memory to reduce the risk of accumulated soft errors resulting in uncorrectable errors in memory data.

Further in accordance with the preferred embodiment, scrub operations interrupt STR mode to avoid the accumulation of soft errors. Also, since scrub operations are generated periodically by memory controller 62 but are not related to accesses to memory 66 for data required by external sources, such as processor 60 or I/O device 64, an immediate return to STR mode following a scrub operation maximizes power savings.

Figure 2:
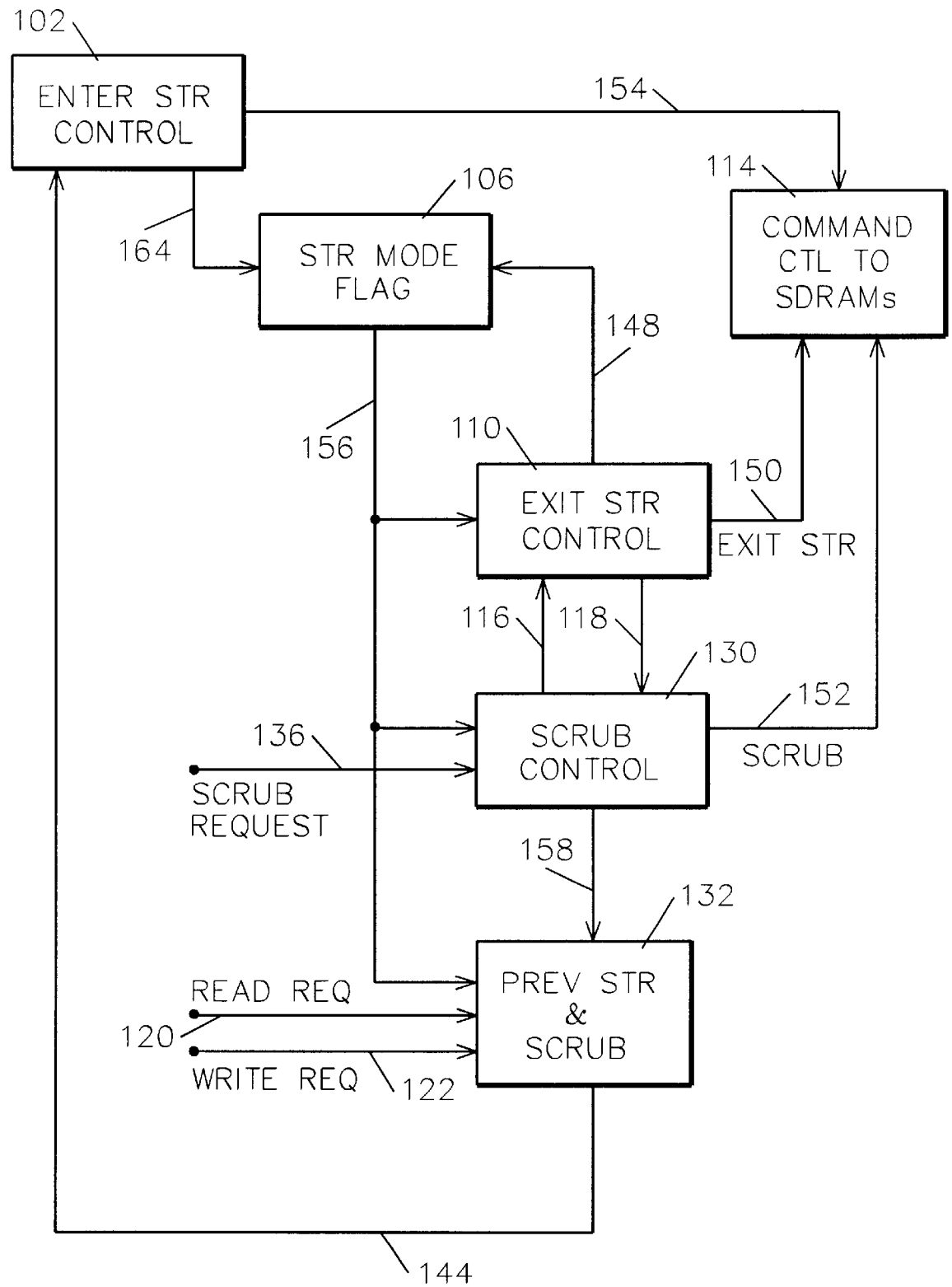
FIG. 2 illustrates the memory controller of FIG. 1 in greater detail.

Referring to FIG. 2, memory controller 62 includes enter STR control 102, STR mode flag 106, exit STR control 110, scrub control 130, previous STR and scrub block 132, and command control 114 to SDRAMs 66.

Write request lines 122 and read request line 120 originate at command queue 68, and carry commands directed to the memory SDRAMs 66 from processor 60 or I/O device 64. For the purpose of this embodiment of the invention, these request lines 120 and 122 are fed to previous STR & scrub block 132.

The outputs of enter STR control block 102 are fed on line 154 to command control block 114 and on line 164 to STR mode flag 106, the output of which is fed on line 156 to exit STR control block 110, scrub control block 130, and previous STR & scrub block 132. Scrub request line 136 is fed to scrub control block 130, the outputs of which are fed on line 116 to exit STR control block 110, scrub line 152 to command control block 114, and line 158 to previous STR & scrub block 132. The output of previous STR & scrub block 132 is fed on line 144 to enter STR control block 102. The outputs of exit STR control 110 are fed on line 148 to STR mode flag 106, exit STR line 150 to command control block 114, and line 118 to scrub control block 130.

Enter STR control 102 initiates the STR mode to memory SDRAMs 66 via command control block 114, which puts the SDRAMs in self timed refresh (STR) mode.

STR mode flag 106 is a bit that indicates whether or not SDRAMs 66 are in self timed refresh mode at any given point of time. This is a flag that is set by line 164 when entering STR mode, and reset when STR mode is exited. (See copending patent application, assignee docket number EN998100, for description of how STR mode is entered and exited.)

Exit STR control 110 handles issuing the STR command to the SDRAMs in the event that a periodic scrub operation is detected (when line 156 goes active).

Scrub control 130 detects a periodic scrub operation while the SDRAMs are in STR mode (line 156 is active) and delays the scrub operation until the memory exits STR mode, at which time it issues a scrub command on line 152 to the SDRAMs 66 via command control block 114.

Previous STR & Scrub 132 remembers that SDRAMs 66 were previously in the STR mode (line 156 has been active) and that a scrub has just completed (line 156 has just gone inactive) and then controls (on line 144 via block 102 and line 154) putting the SDRAMs back into STR mode if there are no new read or write requests coming from queue 68 (lines 120 and 122 are inactive).

Thus, there are provided in this preferred embodiment, the following mechanisms: a mechanism 130 to detect a periodic scrub operation (line 136) while memory SDRAMs 66 are in STR mode (line 156) and to delay the scrub operation (line 152) until memory 66 can exit STR mode (line 150); a mechanism 132 to remember the memory SDRAMs were previously in STR mode (line 156) and to place (line 144) memory SDRAMs 66 back into STR mode immediately following a scrub operation rather than waiting for another period of memory inactivity.

Referring further to FIG. 2 in connection with FIG. 1, in operation, memory controller 62 puts SDRAM memory 66 into self timed refresh mode to save power after an interval of no system 60 or I/O 64 accesses to memory 66, and generates scrubbing operations to correct soft errors.

When memory controller 62 detects a periodic scrub operation (line 136 goes active) while memory SDRAMs 66 are in STR mode (line 156 is active), memory controller 62 (scrub control 130) delays the scrub operation and signals memory SDRAMs 66 to exit STR mode (line 150). Previous STR & scrub flag 132 is turned on to indicate that memory 66 was previously in STR mode and exited STR due to a scrub operation and not due to a processor 60 or I/O device 64 read or write request (lines 120 and 122) to memory 66. Once memory SDRAMs 66 have exited STR mode, memory controller 66 scrub control 130 allows delayed scrub operations (line 136) to access memory normally (line 152). This prevents soft errors from accumulating in memory while memory 66 is in STR mode at the cost of increasing power consumption.

Further, if no other read or write requests 120/122 from a processor 60 or I/O device 64 occur during the scrub operation (line 152), memory controller 62 places the SDRAMs back into STR mode immediately following completion of the scrub operations and does not wait for another interval of no system activity to memory 66. Therefore, memory 66 continues to be scrubbed of soft errors while the energy savings are maximized by immediately returning memory SDRAMs 66 to STR mode. If a memory read or write request 120/122 does occur during the scrub operation (line 152 is active), scrub control 130 turns off (line 158 goes active) flag 132 (the flag indicating memory was previously in STR mode). With flag 132 off, operation is allowed of the counter (not shown, but see interval counter 104 in patent application Ser. No. 09/144,593, for detecting an interval of memory inactivity.

Figure 3:
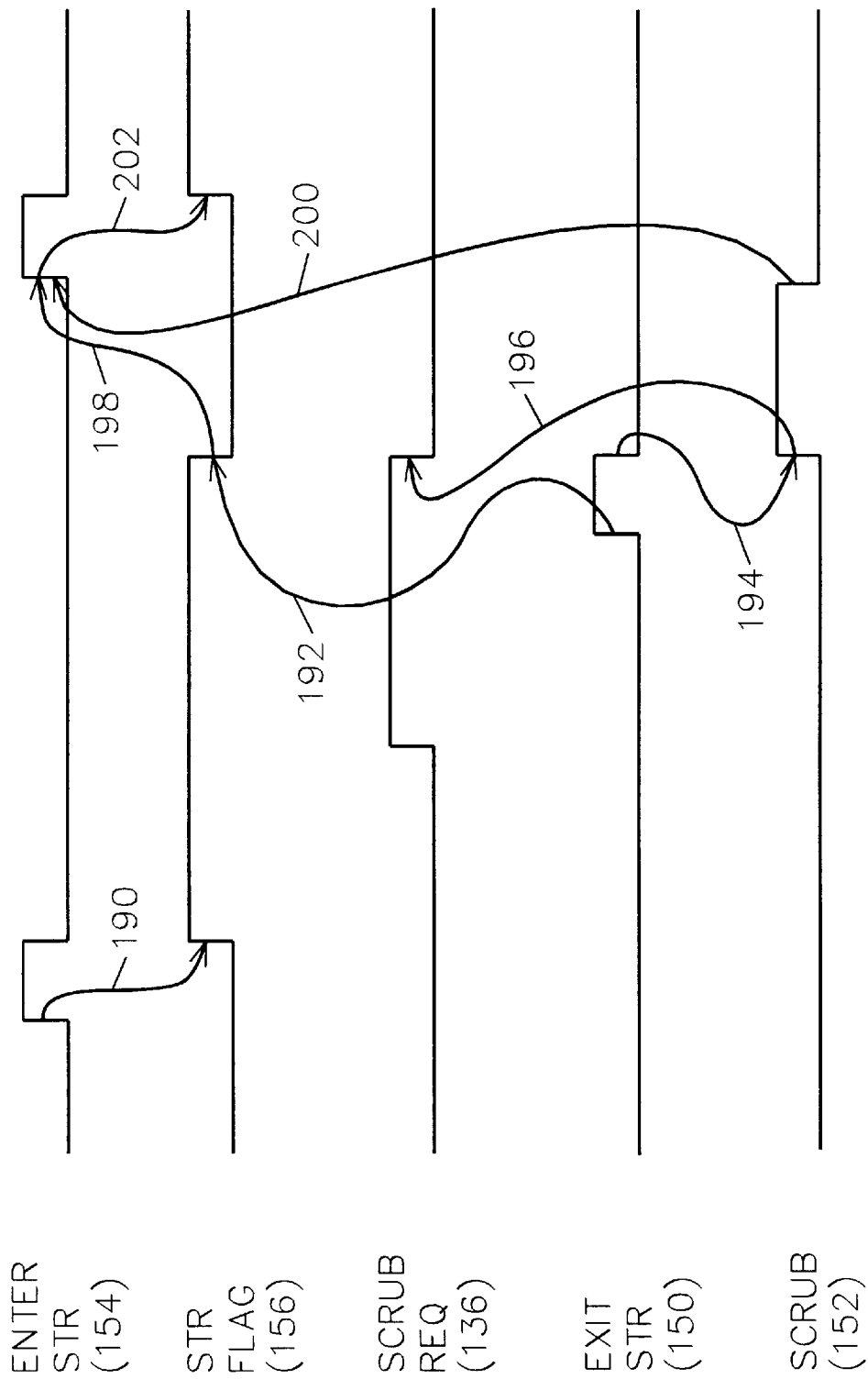
FIG. 3 illustrates the operation of the memory controller of FIG. 2.

Referring to FIG. 3, the operation of the preferred embodiment is illustrated by way of a timing chart. (Reference numerals in parentheses refer to the arrows depicting the flow of control or action.) Responsive (190) to enter STR control line 154 going active, STR command mode flag line 156 becomes active. Thereafter, in this example, a scrub request is received on line 136. When a scrub request 136 is received during STR mode (line 156 is active), scrub control 130 signals exit STR control block 110 via line 116 to activate exit STR line 150. Exit STR line 150 going positive causes (192) STR command 156 to turn off, and delays (194) the scrub command 152. When scrub 152 comes on, scrub request 136 has been serviced, its delay ends, and line 136 drops (196). Upon completion of the scrub operation, scrub line 152 drops. Inasmuch (198) as STR mode had been canceled (line 156 is down), the fall of scrub 152 turns on (200) enter STR control line 154, which again turns on (202) STR mode flag 106, bringing up STR command line 156, and memory controller 66 is back in STR mode awaiting a next scrub request 136.

ADVANTAGES OVER THE PRIOR ART

It is an advantage of the invention that there is provided an improved memory controller.

It is a further advantage of the invention that there is provided an improved controller system and method for memory refresh and scrub operations.

It is a further advantage of the invention that there is provided a system and method for reduced power memory refresh and scrub operations.

ALTERNATIVE EMBODIMENTS

It will be appreciated that, although specific embodiments of the invention have been described herein for purposes of illustration, various modifications may be made without departing from the spirit and scope of the invention. In particular, it is within the scope of the invention to provide a memory device, such as a transmission medium, magnetic or optical tape or disc, or the like, for storing signals for controlling the operation of a computer according to the method of the invention and/or to structure its components in accordance with the system of the invention.

Accordingly, the scope of protection of this invention is limited only by the following claims and their equivalents.

We claim:

1. A method for scrubbing computer memory, comprising the steps of:
   selectively causing said memory to enter and exit self timed refresh (STR) mode;
   upon detecting a scrub request while said memory is in STR mode, terminating STR mode in said memory and thereafter executing said scrub request; and
   upon completing execution of said scrub request, immediately returning said memory to STR mode.

2. A system for scrubbing computer memory, said memory including a self timed refresh (STR) mode of operation, comprising:

a storage controller interfacing said memory to a processor;

said storage controller being responsive to read requests and write requests from said processor for selectively reading from and writing to said memory;

said storage controller generating scrub requests to scrub said memory;

said storage controller further including
- a first scrub controller responsive to receipt of said scrub request while said memory is in STR mode for delaying said scrub operation until said memory exits STR mode and thereafter enabling scrub of said memory; and
- a second scrub controller responsive to completion of scrub of said memory and to absence of storage activity since said memory exited STR mode for returning said memory to STR mode.

3. The system of claim 2, said memory comprising a memory device providing a self timed refresh mode of operation such as a synchronous dynamic random access memory (SDRAM).

4. The system of claim 2, said storage controller further operating following a timed interval of storage inactivity to place said memory into STR mode and while said memory is in STR mode to scrub said memory.

5. A program storage device tangibly embodying a program of instructions which when executed by a machine perform method steps for scrubbing computer memory, said method steps comprising:

selectively placing said memory in self timed refresh (STR) mode;

upon detecting a scrub request while said memory is in said STR mode, terminating said STR mode in said memory and thereafter executing said scrub request; and upon completing execution of said scrub request, immediately returning said memory to said STR mode.

6. An article of manufacture comprising:

a medium having program code embodied therein which when executed by a machine scrubs computer memory, the program code in said article of manufacture comprising:

program code for causing a computer to effect detecting storage activity, said activity selectively including storage read and storage write requests;

program code for causing a computer to effect detecting an interval of storage inactivity;

program code for causing a computer to effect, upon detecting said interval, halting external storage refresh commands and initiating self timed refresh (STR) mode in said memory; and program code for causing a computer to effect, upon detecting storage activity while said memory is in said STR mode, terminating STR mode in said memory;

program code for causing a computer to effect, upon detecting a scrub request while said memory is in STR mode, terminating STR mode in said memory and thereafter executing said scrub request; and program code for causing a computer to effect, upon completing execution of said scrub request, immediately returning said memory to STR mode.

* * * * *